US012262562B2

(12) United States Patent
Mun

(10) Patent No.: US 12,262,562 B2
(45) Date of Patent: Mar. 25, 2025

(54) IMAGE SENSOR WITH VARYING DEPTH DEEP TRENCH ISOLATION STRUCTURE FOR REDUCED CROSSTALK

(71) Applicant: OMNIVISION TECHNOLOGIES, INC., Santa Clara, CA (US)

(72) Inventor: Seong Yeol Mun, Santa Clara, CA (US)

(73) Assignee: OMNIVISION TECHNOLOGIES, INC., Santa Clara, CA (US)

(*) Notice: Subject to any disclaimer, the term of this patent is extended or adjusted under 35 U.S.C. 154(b) by 591 days.

(21) Appl. No.: 17/463,222

(22) Filed: Aug. 31, 2021

(65) Prior Publication Data

US 2023/0067975 A1 Mar. 2, 2023

(51) Int. Cl.
*H10F 39/18* (2025.01)
*H10F 39/00* (2025.01)
*H10F 39/12* (2025.01)

(52) U.S. Cl.
CPC .......... *H10F 39/18* (2025.01); *H10F 39/014* (2025.01); *H10F 39/199* (2025.01); *H10F 39/807* (2025.01)

(58) Field of Classification Search
CPC .......... H01L 27/14643; H01L 27/1463; H01L 27/1464; H01L 27/14689
See application file for complete search history.

(56) References Cited

U.S. PATENT DOCUMENTS

| | | | |
|---|---|---|---|
| 8,530,266 B1 | 9/2013 | Chen et al. | |
| 9,621,834 B2 | 4/2017 | Ui | |
| 9,799,696 B1* | 10/2017 | Tai | H01L 27/1463 |
| 9,923,009 B1* | 3/2018 | Hsiung | H01L 27/14685 |
| 11,189,655 B1* | 11/2021 | Mun | H01L 21/76229 |
| 11,399,150 B2* | 7/2022 | Gao | H04N 25/75 |
| 11,444,108 B2* | 9/2022 | Mun | H01L 27/14641 |

(Continued)

FOREIGN PATENT DOCUMENTS

| | | |
|---|---|---|
| CN | 106981495 A | 7/2017 |
| CN | 110199393 A | 9/2019 |

(Continued)

OTHER PUBLICATIONS

ROC (Taiwan) Patent Application No. 358—Office Action with English Translation mailed Sep. 23, 2019, 14 pages.

(Continued)

*Primary Examiner* — Mounir S Amer
*Assistant Examiner* — Alexander Belousov
(74) *Attorney, Agent, or Firm* — Christensen O'Connor Johnson Kindness PLLC

(57) ABSTRACT

An image sensor comprises a first photodiode, a second photodiode, and a deep trench isolation structure. The first photodiode and the second photodiode are each disposed within a semiconductor substrate. The first photodiode is adjacent to the second photodiode. The deep trench isolation structure has a varying depth disposed within the semiconductor substrate between the first photodiode and the second photodiode. The DTI structure extends the varying depth from a first side of the semiconductor substrate towards a second side of the semiconductor substrate. The first side of the semiconductor substrate is opposite of the second side of the semiconductor substrate.

16 Claims, 9 Drawing Sheets

(56) References Cited

U.S. PATENT DOCUMENTS

| | | | |
|---|---|---|---|
| 11,450,696 B1* | 9/2022 | Zang | H04N 25/75 |
| 11,984,464 B2* | 5/2024 | Mun | H01L 27/1464 |
| 2007/0040922 A1 | 2/2007 | McKee et al. | |
| 2015/0372031 A1* | 12/2015 | Yoon, | H01L 27/1463 |
| | | | 257/446 |
| 2016/0027837 A1* | 1/2016 | Webster | H01L 27/1462 |
| | | | 257/443 |
| 2016/0093651 A1* | 3/2016 | Sato | H01L 27/14638 |
| | | | 257/229 |
| 2017/0018584 A1* | 1/2017 | Ma | H01L 27/14643 |
| 2019/0115388 A1 | 4/2019 | Jung et al. | |
| 2019/0356872 A1* | 11/2019 | Manabe | H04N 25/40 |
| 2020/0098798 A1* | 3/2020 | Takahashi | H01L 27/1461 |
| 2021/0134863 A1 | 5/2021 | Suzuki | |
| 2021/0202553 A1* | 7/2021 | Mun | H01L 27/1463 |
| 2021/0225927 A1* | 7/2021 | Mun | H01L 27/14687 |
| 2021/0313477 A1* | 10/2021 | Kusukawa | H01L 27/14698 |
| 2022/0013551 A1* | 1/2022 | Mun | H01L 21/76283 |
| 2022/0013554 A1* | 1/2022 | Mun | H01L 27/14603 |
| 2022/0159206 A1* | 5/2022 | Gao | H01L 27/14643 |
| 2022/0278144 A1* | 9/2022 | Kao | H01L 27/1463 |

FOREIGN PATENT DOCUMENTS

| | | |
|---|---|---|
| JP | 2008-186814 A | 8/2007 |
| TW | 202123444 A | 6/2021 |

OTHER PUBLICATIONS

Taiwanese Office Action mailed Feb. 7, 2025, issued in related Taiwanese Application No. 111113938 filed Apr. 13, 2022, 8 pages.

\* cited by examiner

200-A

205 — PROVIDING A SEMICONDUCTOR SUBSTRATE INCLUDING A FIRST PHOTODIODE AND A SECOND PHOTODIODE, EACH DISPOSED WITHIN THE SEMICONDUCTOR SUBSTRATE PROXIMATE TO A FIRST SIDE OF THE SEMICONDUCTOR SUBSTRATE, WHEREIN THE FIRST PHOTODIODE IS ADJACENT TO THE SECOND PHOTODIODE

210 — FORMING A DEEP TRENCH ISOLATION (DTI) STRUCTURE WITHIN SEMICONDUCTOR SUBSTRATE, WHEREIN THE DTI STRUCTURE INCLUDES A VARYING DEPTH EXTENDING FROM THE FIRST SIDE TOWARDS THE SECOND SIDE OF THE SEMICONDUCTOR SUBSTRATE, WHEREIN THE VARYING DEPTH OF THE DTI STRUCTURE INCLUDES A FIRST DEPTH OF A FIRST SEGMENT, A SECOND DEPTH OF A SECOND SEGMENT, AND A THIRD DEPTH OF A THIRD SEGMENT

215 — ETCHING A FIRST TRENCH OF THE SECOND DEPTH EXTENDING FROM THE FIRST SIDE TOWARDS THE SECOND SIDE OF THE SEMICONDUCTOR SUBSTRATE USING A FIRST LITHOGRAPHIC PATTERN DURING A FIRST ETCHING STEP, WHEREIN THE FIRST TRENCH IS DISPOSED BETWEEN THE FIRST PHOTODIODE AND THE SECOND PHOTODIODE

220 — ETCHING THE FIRST TRENCH FURTHER DURING A SECOND ETCHING STEP AFTER THE FIRST ETCHING STEP USING A SECOND LITHOGRAPHIC PATTERN SUCH THAT A FIRST PORTION OF THE FIRST TRENCH EXTENDS THE FIRST DEPTH WHILE A SECOND PORTION AND A THIRD PORTION OF THE FIRST TRENCH RESPECTIVELY REMAIN AT THE SECOND DEPTH AND THE THIRD DEPTH

225 — BACKFILLING THE FIRST PORTION, THE SECOND PORTION, AND THE THIRD PORTION OF THE FIRST TRENCH WITH AT LEAST ONE OF AN OXIDE MATERIAL OR A METAL MATERIAL TO RESPECTIVELY FORM THE FIRST SEGMENT, THE SECOND SEGMENT, AND THE THIRD SEGMENT OF THE DTI STRUCTURE

230 — OPTIONALLY LINING THE FIRST TRENCH WITH A HIGH-κ DIELECTRIC SHELL BEFORE THE BACKFILLING SUCH THAT THE FIRST SEGMENT, THE SECOND SEGMENT, AND THE THIRD SEGMENT COLLECTIVELY CORRESPOND TO A CONTIGUOUS PORTION OF THE DTI STRUCTURE FORMED OF THE HIGH-κ DIELECTRIC SHELL FILLED WITH AT LEAST ONE OF THE OXIDE MATERIAL OR A METAL MATERIAL

IMAGE SENSOR WITH VARYING DEPTH DEEP TRENCH ISOLATION STRUCTURE FOR REDUCED CROSSTALK

TECHNICAL FIELD

This disclosure relates generally to image sensors, and in particular but not exclusively, relates to back-illuminated CMOS image sensors.

BACKGROUND INFORMATION

Image sensors have become ubiquitous and are now widely used in digital cameras, cellular phones, security cameras, as well as, medical, automobile, and other applications. As image sensors are integrated into a broader range of electronic devices it is desirable to enhance their functionality, performance metrics, and the like in as many ways as possible (e.g., resolution, power consumption, dynamic range, etc.) through both device architecture design as well as image acquisition techniques.

The typical image sensor operates in response to image light reflected from an external scene being incident upon the image sensor. The image sensor includes an array of pixels having photosensitive elements (e.g., photodiodes) that absorb a portion of the incident image light and generate image charge upon absorption of the image light. The image charge of each of the pixels may be measured as an output voltage of each photosensitive element that varies as a function of the incident image light. In other words, the amount of image charge generated is proportional to the intensity of the image light incident upon a given pixel, which is utilized to produce a digital image (i.e., image data) representing the external scene. However, electrical crosstalk or optical crosstalk may inadvertently influence the amount of image charge associated with one or more pixels of the image sensor, which could inhibit faithful reproduction of the external scene.

BRIEF DESCRIPTION OF THE DRAWINGS

Non-limiting and non-exhaustive embodiments of the invention are described with reference to the following figures, wherein like reference numerals refer to like parts throughout the various views unless otherwise specified. Not all instances of an element are necessarily labeled so as not to clutter the drawings where appropriate. The drawings are not necessarily to scale, emphasis instead being placed upon illustrating the principles being described.

FIGS. 2A-2B illustrate an example process for manufacturing an image sensor with a varying depth deep trench isolation structure, in accordance with the teachings of the present disclosure.

DETAILED DESCRIPTION

Figure 1A:
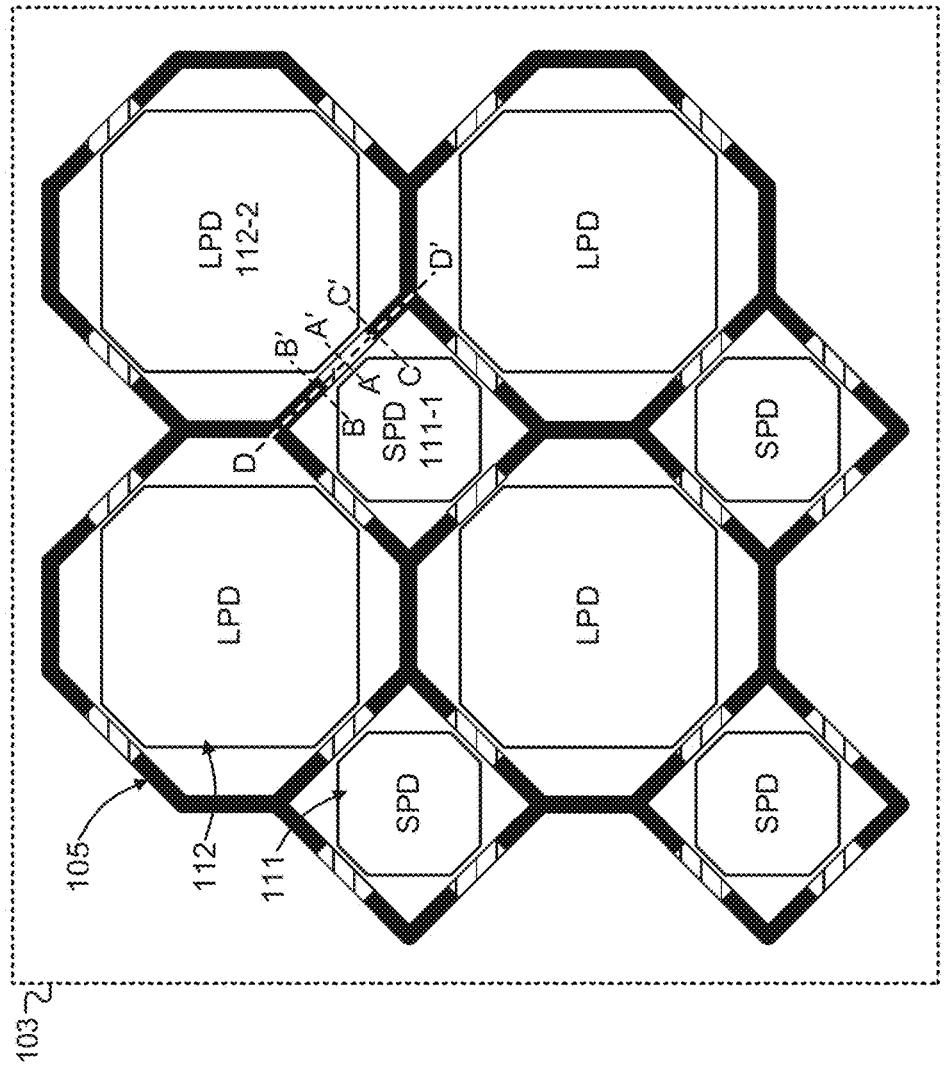
FIG. 1A illustrates an example backside view of an image sensor with a varying depth deep trench isolation structure for reduced crosstalk, in accordance with the teachings of the present disclosure.

Embodiments of an apparatus, system, and method each including or otherwise related to an image sensor with a varying depth deep trench isolation (DTI) structure are disclosed herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

As pixel control circuitry decreases in size and photodiodes become more closely packed together the influence of electrical and/or optical crosstalk on image sensor performance increases. This is especially true for split photodiode image sensors for high dynamic range applications, in which photodiodes with differing full well capacities are adjacent to one another. For example, high angle light relative to a surface normal may be incident upon a large photodiode and propagate through the large photodiode to reach a neighboring small photodiode as optical crosstalk. This optical crosstalk may degrade the dynamic range performance of the image sensor by degrading signal-tonoise ratio (SNR) and/or color matching performance between small and large photodiodes, which can cause issues in color reproduction after color correction operation (e.g., after color correction matrix processing).

Described herein are embodiments related to an image sensor with a varying depth deep trench isolation (DTI) structure to reduce optical crosstalk and/or electrical crosstalk between at least neighboring photodiodes in a pixel array of the image sensor. The varying depth DTI structure is particularly well suited for, but not limited to, image sensors with a split-pixel layout in which the lateral distance between adjacent photodiodes is not uniform. As the lateral distance between adjacent photodiodes decreases the likelihood that optical and/or electrical crosstalk will occur increases. To compensate for the non-uniform distance between adjacent photodiodes, the varying depth DTI structure described in embodiments herein includes a plurality of segments that may respectively extend different depths through a semiconductor substrate to provide increased optical crosstalk and/or electrical crosstalk mitigation as the lateral distance decreases while still maintaining structural integrity of the semiconductor substrate.

It is appreciated that the term "photodiode" may correspond to a region within the semiconductor substrate that has been doped with an opposite polarity of the semiconductor substrate such that an outer perimeter of the region, herein referred to as a photodiode, forms a PN junction or a PIN junction. For example, an n-doped region disposed within a p-type semiconductor substrate (e.g., a p-type doped silicon wafer) forms a corresponding photodiode. In some embodiments, a given pixel may further include a pinning layer (e.g., a layer or region of the semiconductor substrate disposed between a side of the semiconductor substrate and the photodiode that has a polarity opposite of the semiconductor substrate) to form a pinned photodiode. The pinning layer may be a doped region or layer within the semiconductor substrate or otherwise coupled to the semiconductor substrate that has a polarity opposite of the photodiode (e.g., p-type region when the photodiode is n-type).

It is further appreciated that embodiments described herein associated with a varying depth DTI structure will be discussed in the context of a backside illuminated CMOS image sensor with a split pixel layout including a plurality of small photodiodes and a plurality of large photodiodes (see, e.g., FIG. 1A, FIG. 1B, FIG. 3A, and FIG. 3B). However, it is appreciated that such embodiments are non-limiting and that the varying depth DTI structure may be implemented in other image sensor configurations not explicitly described herein (e.g., pixel layouts other than a split pixel layout, front side illumination, or the like).

FIG. 1A illustrates an example backside view of an image sensor 101 with a varying depth deep trench isolation structure 105 for reduced crosstalk, in accordance with the teachings of the present disclosure. As illustrated the image sensor 101 includes a plurality of small photodiodes 111 (e.g., first photodiode 111-1), a plurality of large photodiodes 112 (e.g., second photodiode 112-2), and a varying depth DTI structure 105 each disposed within, at least in part, a semiconductor substrate 103 (e.g., an n-doped silicon substrate, a p-doped silicon substrate, an intrinsic silicon substrate, a bulk silicon substrate, or the like). In some embodiments, one or more small photodiodes included in the plurality of small photodiodes 111 have a first full well capacity and one or more large photodiodes included in the plurality of large photodiodes 112 have a second full well capacity that is greater than the first full well capacity.

Additionally, in some embodiments, each of the plurality of large photodiodes 112 may have a greater physical dimension (e.g., length, width, depth, area, or the like) relative to each of the plurality of small photodiodes 111. In the same or other embodiments, each of the plurality of large photodiodes 112 may have a greater sensitivity to light or a higher quantum efficiency relative to each of the plurality of small photodiodes 111.

As illustrated in FIG. 1A, the image sensor 101 has a split-pixel layout with the plurality of small photodiodes 111 and the plurality of large photodiodes 112 arranged in rows and columns to respectively form a first array of the plurality of small photodiodes 111 and a second array of the plurality of large photodiodes 112. In the illustrated embodiment the first array of the plurality of small photodiodes 111 is interspersed with the second array of the plurality of large photodiodes 112 such that each individual small photodiode (e.g., the first photodiode 111-1) included in the plurality of small photodiodes is laterally surrounded by neighboring large photodiodes included in the plurality of large photodiodes 112. In one embodiment, the first array and the second array are each two-by-two arrays, but it is appreciated that any number of photodiodes may be included in the image sensor 101. In some embodiments there may be an equal number of photodiodes included in the plurality of small photodiodes 111 and the plurality of large photodiodes 112. In other embodiments there may be a greater number of photodiodes included in the plurality of small photodiodes 111 relative to plurality of large photodiodes 112 or vice versa.

In some embodiments, photodiodes included in the plurality of small photodiodes 111 and the plurality of large photodiodes 112 are laterally surrounded by a DTI structure 105 with a varying depth to mitigate optical crosstalk and/or electrical crosstalk between neighboring (e.g., adjacent) photodiodes. The varying depth of the DTI structure 105 provides increased crosstalk mitigation as the lateral distance between adjacent photodiodes decreases. For example, in the split-pixel layout of image sensor 101, each photodiode included in the plurality of small photodiodes 111 and the plurality of large photodiodes 112 are disposed proximate to one or more instances of a contiguous portion of the DTI structure 105 such that a corresponding instance of the contiguous portion of the DTI structure with the varying depth is disposed between each adjacent small-large photodiode pair included in a pixel array formed by the first array of the plurality of small photodiodes 111 interspersed with the second array of the plurality of large photodiodes 112. Accordingly, the instances of the contiguous portion of the DTI structure 105 may collectively form a DTI grid that individually surrounds each photodiode included in the plurality of small photodiodes 111 and the plurality of large photodiodes 112 as illustrated in FIG. 1A.

Figure 1B:
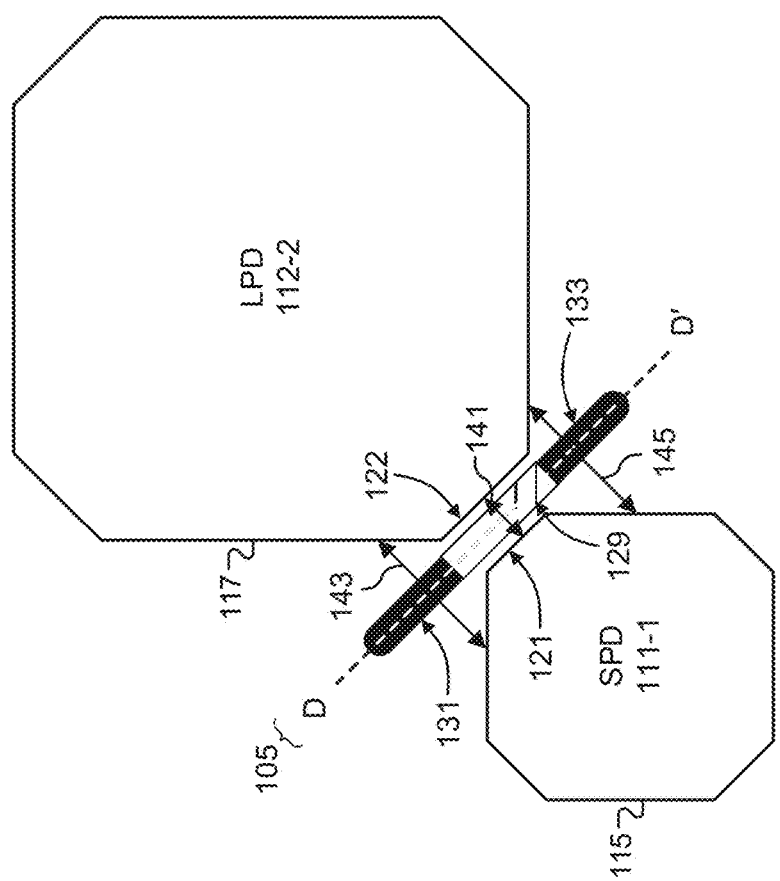
FIG. 1B illustrates a zoomed-in view of the example backside view of the image sensor shown in FIG. 1A, which shows an instance of a contiguous portion of the DTI structure with the varying depth, in accordance with the teachings of the present disclosure.

FIG. 1B illustrates a zoomed-in view 150 of the example backside view of the image sensor 101 shown in FIG. 1A, which shows an instance of the contiguous portion of the DTI structure 105 with the varying depth, in accordance with the teachings of the present disclosure. The zoomed-in view 150 shows the first photodiode 111-1, the second photodiode 112-2, and an instance of the contiguous portion of the DTI structure 105 disposed within the semiconductor substrate 103. The first photodiode 111-1 is disposed adjacent (e.g., neighboring) to the second photodiode 112-2 with the contiguous portion of the DTI structure 105 disposed between the first photodiode 111-1 and the second photodiode 112-2. The contiguous portion of the DTI structure 105 with the varying depth includes a first segment 129, a second segment 131, and a third segment 133. As illustrated, the first segment 129 is coupled between the second segment 131 and the third segment 133 to form the contiguous portion of the DTI structure 105 with the varying depth, which extends from a first side (e.g., backside of the semiconductor substrate 103 or illuminated side of the semiconductor substrate 103) towards a second side (e.g., front side of the semiconductor substrate 103 or non-illuminated side of the semiconductor substrate 103). The varying depth (see, e.g., FIG. 1C, FIG. 1D, FIG. 1E, and FIG. 1F in the context of FIG. 1A) includes a first depth of the first segment 129, a second depth of the second segment 131, and a third depth of the third segment 133. In some embodiments, the first depth of the first segment 129 is greater than the second depth of the second segment 131 and/or the third depth of the third segment 133.

In the illustrated embodiment of FIG. 1B, a distance between the first photodiode 111-1 and the second photodiode 112-2 taken along a direction perpendicular to line D-D' is non-uniform. In some embodiments, a first distance 141 between the first photodiode 111-1 and the second photodiode 112-2 that extends through the first segment 129 is less than a second distance 143 between the first photodiode 111-1 and the second photodiode 112-2 that extends through the second segment 131. In the same or other embodiments the first distance 141 between the first photodiode 111-1 and the second photodiode 112-2 that extends through the first segment 129 is less than a third distance 145 between the first photodiode 111-1 and the second photodiode 112-2 that extends through the third segment 133. In some embodiments, the first distance 141, the second distance 143, and the third distance 145 are taken along a substantially common direction (e.g., the direction perpendicular to line D-D').

As illustrated in FIG. 1B, the first photodiode 111-1 has a first cross-sectional shape 115 including a first truncated edge 121 and the second photodiode 112-2 has a second cross-sectional shape 117 including a second truncated edge 122. Accordingly, in some embodiments the first cross-sectional shape 115 of the first photodiode 111-1 and/or the second cross-sectional shape 117 of the second photodiode 112-2 correspond to a truncated square, a truncated rectangle, a truncated circle, a squircle, a rounded square, or any other shape to optimize packing density of the plurality of small photodiodes 111 and the plurality of large photodiodes 112. In one embodiment, the first photodiode 111-1 and the second photodiode 112-2 are positioned within the semiconductor substrate 103 such that the first truncated edge 121 of the first photodiode 111-1 faces the second truncated edge 122 of the second photodiode 112-2. In some embodiments, the first segment 129 of the DTI structure 105 is disposed between the first truncated edge 121 of the first photodiode 111-1 and the second truncated edge 122 of the second photodiode 112-2 to provide optical and/or electrical isolation between photo-sensing regions of neighboring first photodiode 111-1 and second photodiode 112-2. In the same or other embodiments, the first segment 129 of the DTI structure 105 extends a length (e.g., in a direction along the line D-D') between the first truncated edge 121 and the second truncated edge 122 such that at least one of the second segment 131 or the third segment 133 is not directly disposed between the first truncated edge 121 of the first photodiode 111-1 and the second truncated edge 122 of the second photodiode 112-2.

Figure 1C:
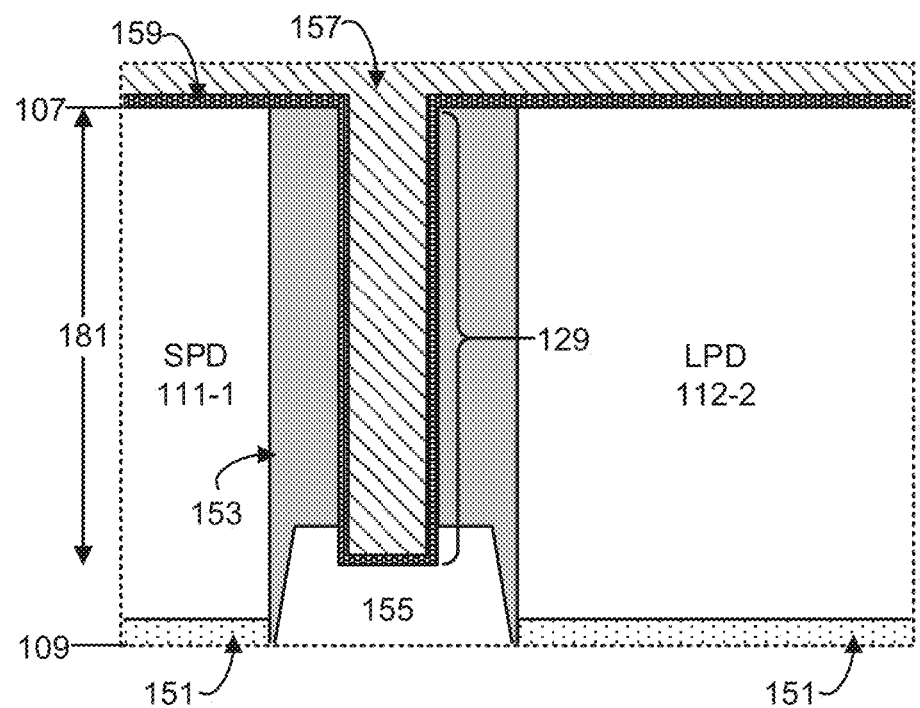
FIG. 1C illustrates a cross-sectional view along the line A-A' shown in FIG. 1A, in accordance with the teachings of the present disclosure.

FIG. 1C illustrates a cross-sectional view of the image sensor 101 along the line A-A' shown in FIG. 1A, in accordance with the teachings of the present disclosure. In particular, FIG. 1C shows the first photodiode 111-1 adjacent to the second photodiode 112-2 and are each disposed within the semiconductor substrate 103 proximate to a first side 107 of the semiconductor substrate 103. FIG. 1C also shows the first segment 129 of the contiguous portion of the DTI structure 105 extending a first depth 181 from the first side 107 (e.g., backside) towards a second side (e.g., front side) of the semiconductor substrate 103. In some embodiments, the first segment 129 is formed of at least an oxide material (e.g., silicon dioxide, a high-κ oxide such as hafnium oxide, aluminum oxide, or otherwise). For example, in the illustrated embodiment, the first segment 129 is formed of a high-κ dielectric shell 159 that is filled with at least one of an oxide material 157 (e.g., silicon dioxide) or a metal material (e.g., tungsten or aluminum). In some embodiments, the high-κ dielectric shell 159 includes one or more material layers. In the same or other embodiments, the high-κ dielectric shell 159 is approximately 200-600 angstroms thick. It is appreciated that the term "high-κ oxide" generally corresponds to any oxide material having a dielectric constant greater than the dielectric constant of silicon dioxide. In other embodiments, the high-K dielectric shell 159 may be omitted or replaced with a liner material having a refractive index sufficient to reflect, refract, or otherwise mitigate high angle light from propagating through the first segment 129 between the first photodiode 111-1 and the second photodiode 112-2. In some embodiments the high-κ dielectric shell 159, the liner material, and/or the oxide material 157 may correspond to any dielectric material having an index of refraction lower than an index of refraction of the semiconductor substrate 103 (e.g., silicon substrate) to induce reflection (e.g., total internal reflection to prevent or otherwise reduce optical crosstalk and mitigate light from propagating from an incident photodiode to an adjacent photodiode).

As illustrated in FIG. 1C, the image sensor 103 further includes a shallow trench isolation (STI) structure 155 disposed proximate to the second side 109 (e.g., front side) of the semiconductor substrate 103 between the first photodiode 111-1 and the second photodiode 112-2. In some embodiments, the shallow trench isolation structure 155 extends a depth from the second side 109 (e.g., front side) of the semiconductor substrate 103 toward the first side 107 (e.g., backside) of the semiconductor substrate 103. In some embodiments, the first segment 129 of the DTI structure 105 directly contacts a surface (e.g., a bottom surface) of the STI structure 155 such that an isolation barrier extends continuously from the first side 107 to the second side 109 to mitigate optical crosstalk and/or electrical crosstalk between the first photodiode 111-1 and the second photodiode 112-2. In some embodiments, the first segment 129 of the DTI structure 105 extends and is structurally connected with the STI structure 155. In one embodiment, the first segment 129 extends into the STI structure 155 such that a distal end of the first segment 129 is at least partially surrounded by the STI structure 155. In the same or other embodiments, a width of the first segment 129 extending between the first photodiode 111-1 and the second photodiode 112-2 is less than a width of the STI structure 155 extending between the first photodiode 111-1 and the second photodiode 112-2.

In the illustrated embodiment, the image sensor 101 further includes a well 153 disposed in the semiconductor substrate 103 between the first photodiode 111-1 and the second photodiode 112-2. It is appreciated that the first photodiode 111-1 and the second photodiode 112-2 each have a first conductivity type (e.g., n-type or p-type) and that the well 153 has a second conductivity type (e.g., p-type when the first conductive type is n-type or n-type when the first conductivity type is p-type) opposite of the first conductivity type. In some embodiments, the well 153 and the semiconductor substrate 103 are of the same conductivity type. In some embodiments, the contiguous portion of the DTI structure 105, including the first segment 129, the second segment 131 (see, e.g., FIG. 1D), the third segment 133 (see, e.g., FID. IE), and the STI structure 155 are each disposed, at least in part, within or otherwise surrounded by the well 153. In some embodiments, the well 153 is a region of the semiconductor substrate 103 that has been doped (e.g., via implantation from the second side 109) to provide additional isolation extending between the first photodiode 111-1 and the second photodiode 112-2.

As shown in FIG. 1C, the first photodiode 111-1 and the second photodiode 112-2 are each pinned photodiodes and are coupled to a respective pinning layer 151. It is appreciated that the pinning layer 151 has the second conductivity type opposite of the first conductivity type of the first photodiode 111-1 and the second photodiode 112-2. It is appreciated that while the conductivity type of the semiconductor substrate 103, the pinning layer 151, and the well 153 may share a common conductivity type (e.g., n-type or p-type) in some embodiments, the degree of doping is not necessarily equal (e.g., differing in dopant density per unit area, doping profile, or otherwise). For example, the doping concentration of the well 153 may be greater than the doping concentration of the semiconductor substrate 103. It is appreciated that in other embodiments the pinning layer 151 may be omitted.

Figure 1D:
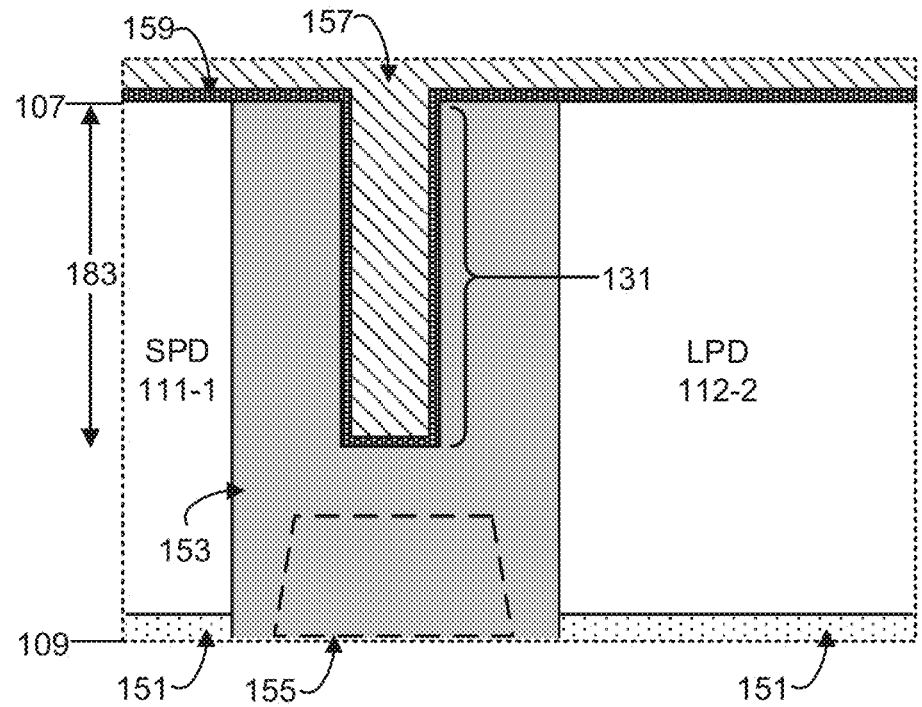
FIG. 1D illustrates a cross-sectional view along the line B-B' shown in FIG. 1A, in accordance with the teachings of the present disclosure.

FIG. 1D illustrates a cross-sectional view of the image sensor 101 along the line B-B' shown in FIG. 1A, in accordance with the teachings of the present disclosure. FIG. 1D illustrates many features similar to the view shown in FIG. 1C, but corresponds to a view focused on the second segment 131 of the contiguous portion of the DTI structure 105 illustrated in FIG. 1B and FIG. 1A. As illustrated, the second segment 131 extends a second depth 183 from the first side 107 towards the second side 109 of the semiconductor substrate 103. It is appreciated that the second depth 183 is different from the first depth 181. In some embodiments, the first depth 181 extends deeper into the semiconductor substrate 103 than the second depth 183 (see, e.g., FIG. 1D). Additionally, it is appreciated that the STI structure 155 optionally extends from the second side 109 under the second segment 131 such that a portion of the semiconductor substrate 103 (e.g., a doped portion of the semiconductor substrate 103 corresponding to a portion of the well 153) is disposed between the second segment 131 and the STI structure 155. In other words, the second segment 131 does not directly contact the STI structure 155. In other embodiments the STI structure 155 may not extend under the second segment 131 (e.g., the STI structure 155 is confined proximate to the first segment 129 illustrated in FIG. 1C).

Figure 1E:
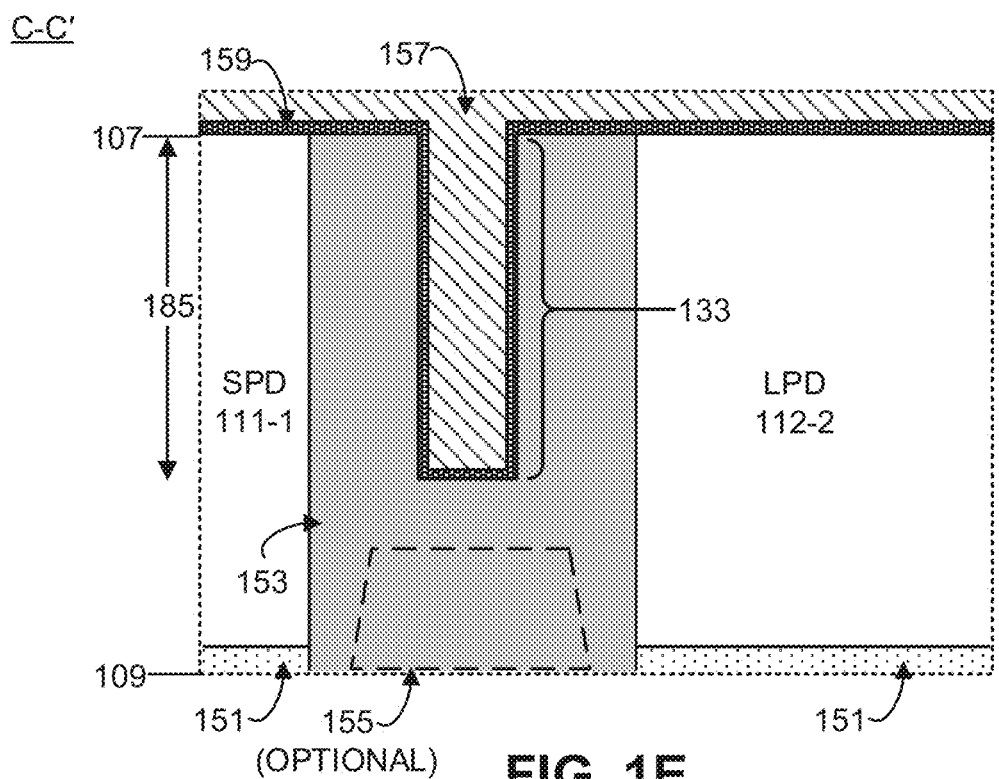
FIG. 1E illustrates a cross-sectional view along the line C-C' shown in FIG. 1A, in accordance with the teachings of the present disclosure.

FIG. 1E illustrates a cross-sectional view of the image sensor 101 along the line C-C' shown in FIG. 1A, in accordance with the teachings of the present disclosure. FIG. 1E illustrates many features similar to the view shown in FIG. 1C, but corresponds to a view focused on the third segment 133 of the contiguous portion of the DTI structure 105 illustrated in FIG. 1B and FIG. 1A. As illustrated, the third segment 133 extends a third depth 185 from the first side 107 towards the second side 109 of the semiconductor substrate 103. It is appreciated that the third depth 185 is different from the first depth 181. In some embodiments, the first depth 181 extends deeper into the semiconductor substrate 103 than the third depth 185 (see, e.g., FIG. 1E). In some embodiments the second depth 183 illustrated in FIG. 1D may be substantially equal to the third depth 185 illustrated in FIG. 1E. In other embodiments, the second depth 183 and the third depth 185 may not be equal. Additionally, it is appreciated that the STI structure 155 optionally extends under the third segment 133 such that a portion of the semiconductor substrate 103 (e.g., a doped portion of the semiconductor substrate 103 corresponding to a portion of the well 153) is disposed between the third segment 133 and the STI structure 155. In other words, the third segment 133 does not directly contact the STI structure 155. In other embodiments the STI structure 155 may not extend under the third segment 133 (e.g., the STI structure 155 is confined proximate to the first segment 129 illustrated in FIG. 1C).

Figure 1F:
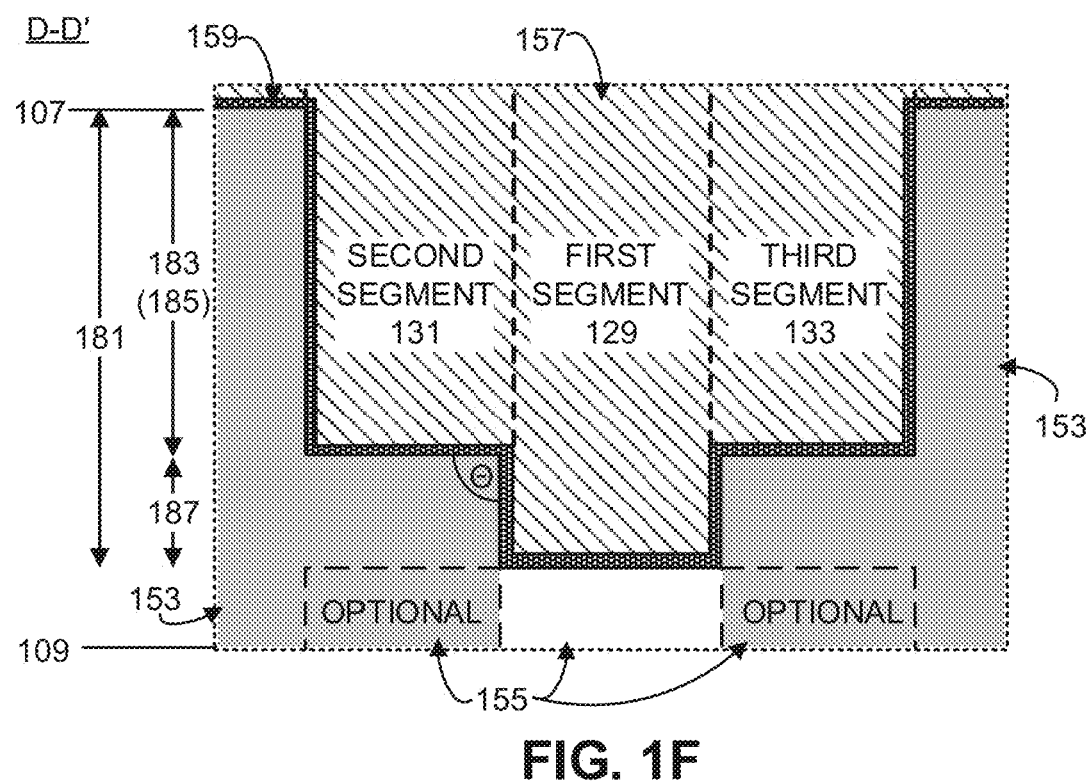
FIG. 1F illustrates a cross-sectional view along the line D-D' shown in FIG. 1A, in accordance with the teachings of the present disclosure.

FIG. 1F illustrates a cross-sectional view of the image sensor 101 along the line D-D' shown in FIG. 1A, in accordance with the teachings of the present disclosure. More specifically, FIG. 1F shows the varying depth of the contiguous portion of the DTI structure 105 (see, e.g., FIG. 1B), which includes the first depth 181 of the first segment 129, the second depth 183 of the second segment 131, and the third depth 185 of the third segment 133. As illustrated, the first depth 181 is greater than the second depth 183 and the third depth 185. In the illustrated embodiment, the second depth 183 is substantially equal to the third depth 185. It is appreciated that the difference between the first depth 181 and the second depth 183 or the third depth 185 is equal to an extended distance 187, which is achieved via a second etching step (see, e.g., FIG. 2A and FIG. 2B). In one embodiment, the second depth 183 and/or the third depth 185 is approximately 1.5 μm to 2.5 μm, which may be dependent on a thickness of the semiconductor substrate 103 (e.g., approximately 3 μm-6 μm) such that there is at least approximately 1 μm from the distal end of the second segment 131 or the third segment 133 to the second side 109 of the semiconductor substrate 103. In the same or other embodiments, the extended depth 187 is less than or equal to the second depth 183 or the third depth 185. In another embodiment, the first depth 181 is approximately twice the depth as the second depth 183 or the third depth 185. It is appreciated that the term "approximately" corresponds to ±10% of a given value.

In some embodiments, the contiguous portion of the DTI structure 105 abruptly transitions between the first depth 181 of the first segment 129 and the second depth 183 of the second segment 131 (e.g., Θ is 90°±5°). In other embodiments, the angle, Θ, between the first segment 129 and the second segment 131 is exactly 90°, less than 90°, or greater than 90°. In the same or other embodiments, the contiguous portion of the DTI structure 105 abruptly transitions between the first depth 181 of the first segment 129 and the third depth 185 of the third segment 133 such that the angle between the first segment 129 and the third segment 133 is 90°±5°. In other embodiments, the angle between the first segment 129 and the third segment 133 is exactly 90°, less than 90°, or greater than 90°. In other words, depending on the configuration of the varying depth of the contiguous portion of the DTI structure 105, the transition between the different depths (e.g., first depth 181 and the second depth 183 or the third depth 185) may be a vertical transition, a gradual transition, or otherwise.

As illustrated in FIG. 1F, the STI structure 155 is aligned with the first segment 129 of the DTI structure 105. In some embodiments the STI structure 155 and the first segment 129 of the DTI structure 105 have a substantially equal length (e.g., in a direction parallel to the first side 107 and/or second side 109 of the semiconductor substrate 103) such that the STI structure 155 is not disposed between the second segment 131 of the DTI structure 105 and the second side 109 of the semiconductor substrate 103. In other embodiments, the STI structure 155 may optionally extend under the second segment 131 and/or the third segment 133. However, it is noted that in the same embodiment, a portion of the semiconductor substrate 103 containing the well 153 is disposed between the second segment 131 and the optional STI structure 155. Similarly, in the same embodiment, a portion of the semiconductor substrate 103 containing the well 153 is disposed between the third segment 133 and the optional STI structure 155.

FIGS. 2A-2B illustrate an example process 200-A and 200-B for manufacturing an image sensor with a varying depth DTI structure, in accordance with the teachings of the present disclosure. Process 200-A and 200-B may be implemented for fabricating the DTI structure 105 with the varying depth of the image sensor 101 illustrated in FIGS. 1A-1F. It is appreciated that the numbered blocks of process 200-A and 200-B, including blocks 205-230, may occur in any order and even in parallel. Additionally, blocks may be added to, or removed from, process 200-A and 200-B in accordance with the teachings of the present disclosure.

Block 205 shows providing a semiconductor substrate having a first side and a second side opposite to the first side and further including a first photodiode and a second photodiode that are each disposed within the semiconductor substrate proximate to the second side (e.g., front side) of the semiconductor substrate. In some embodiments, the first photodiode is adjacent to (e.g., neighboring) the second photodiode. In some embodiments, the first photodiode has a full well capacity lower than the neighboring second photodiode. In the same or other embodiments, the first photodiode has light sensitivity lower than the second photodiode.

Block 210 illustrates forming a DTI structure within the semiconductor substrate. The DTI structure has a varying depth that extends from the first side (e.g., backside) towards the second side of the semiconductor substrate between the first photodiode and the second photodiode. The DTI structure includes a first segment coupled or structurally connected between a second segment and a third segment that collectively form a contiguous portion of the DTI structure with the varying depth. The varying depth of the contiguous portion of the DTI structure includes a first depth of the first segment, a second depth of the second segment, and a third depth of the third segment. In some embodiments, the first depth is greater than the second depth and the third depth.

Blocks 215-230 illustrated in FIG. 2B show process 200-B, which is a subprocess of process 200-A and particularly focuses on a method of manufacturing the DTI structure with the varying depth, in accordance with the teachings of the present disclosure.

Block 215 shows etching a first trench that extends the second depth from the first side towards the second side of the semiconductor substrate during a first etching step using a first lithography pattern. In one embodiment the first trench is disposed between the first photodiode and the second photodiode (e.g., such that the first trench corresponds to at least a trench utilized to form the first segment 129 illustrated in FIG. 1F).

It is appreciated that in some embodiments standard lithographic techniques may be utilized to protect portions of the semiconductor substrate proximate to the first side that are not to be etched during the first etching step. For example, a nitride hard mask and photoresist layer may be deposited on the first side of the semiconductor substrate. A mask (see, e.g., FIGS. 2C-2E) may then be utilized to selectively etch during the first etching step. Upon completion of the first etching step, the photoresist layer may be stripped and cleaned from the first side of the semiconductor substrate in order to proceed with subsequent steps in the manufacturing process.

Block 220 illustrates etching the first trench further during a second etching step occurring after the first etching step using a second lithography pattern such that a first portion of the first trench extends the first depth (e.g., the first portion of the first trench is etched further to extend the depth from being the second depth to being the first depth) while a second portion (e.g., corresponding to the second segment 131 illustrated in FIG. 1F) and a third portion (e.g., corresponding to the third segment 133 illustrated in FIG. 1F) of the first trench respectively are not further etched and have a depth that remains at or otherwise corresponds to the second depth and the third depth. In other words, the first portion of the first trench is etched twice (i.e., during both the first etching step and the second etching step) while the second portion and the third portion are only etched once (i.e., during either the first etching step or the second etching step). In such an embodiment the total etch depth of the first portion corresponds to the first depth (e.g., the first depth 181 illustrated in FIG. 1F) while the total etch depth of the second portion and the third portion respectively corresponds to the second depth and the third depth (e.g., the second depth 183 and the third depth 185 illustrated in FIG. 1F). In some embodiments, the second depth is substantially equal to the third depth. However, it is appreciated that in other embodiments additional etching steps may be utilized when more than two etch depths are to be included in the varying depth of the DTI structure.

In some embodiments, the semiconductor substrate includes a shallow trench isolation (STI) structure (see, e.g., FIG. 1F) disposed proximate to the second side of the semiconductor substrate between the first photodiode and the second photodiode. In the same embodiment, the first portion of the first trench is aligned with the STI structure and extends towards the STI structure such that the first segment of the DTI structure directly contacts the STI structure. In some embodiments, the second etching step may partially etch or otherwise extend until reaching the STI structure.

Similar to block 215, it is appreciated that in some embodiments standard lithographic techniques may be utilized to protect portions of the semiconductor substrate proximate to the first side that are not to be etched during the second etching step. For example, a photoresist layer may be deposited on the first side of the semiconductor substrate (e.g., on top of the nitride hard mask formed in advance of the first etching step). A mask (see, e.g., FIGS. 2C-2E) may then be utilized to selectively etch during the second or subsequent etching step. Upon completion of the second or subsequent etching step, the photoresist layer may be stripped and cleaned from the first side of the semiconductor substrate in order to proceed with subsequent steps in the manufacturing process. In some embodiments, when the multiple etching steps have completed, the nitride hard mask may also be removed in preparing for subsequent steps for forming the DTI structure within the trenches.

Block 225 shows backfilling the first portion, the second portion, and the third portion of the first trench with at least one of an oxide material or a metal material to respectively form the first segment, the second segment, and the third segment of the DTI structure.

Block 230 illustrates optionally lining at least the first trench with a high-κ dielectric shell before the backfilling (i.e., block 225) such that the first segment, the second segment, and the third segment collectively correspond to a contiguous portion of the DTI structure formed of the high-κ dielectric shell filled with at least one of the oxide material or the metal material. In some embodiments, the high-κ dielectric shell is formed of one or more high-κ dielectric material layers including at least one of a hafnium oxide ($HfO_2$) layer, an aluminum oxide ($Al_2O_3$) layer, a zirconium oxide ($ZrO_2$) layer, a tantalum oxide ($Ta_2O_5$) layer, a titanium oxide ($TiO_2$) layer, or any combination thereof.

Figure 2C:
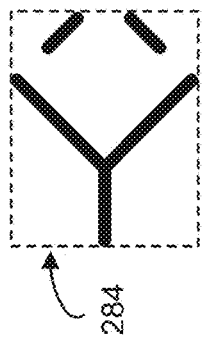
FIGS. 2C-2E illustrate example lithographic patterns from a multiple etching step process for forming a varying depth deep trench isolation structure, in accordance with the teachings of the present disclosure.
Figure 2D:
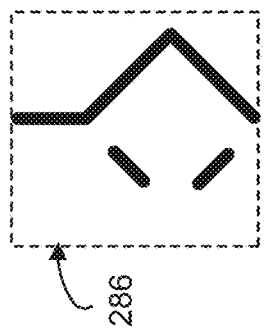
Figure 2E:
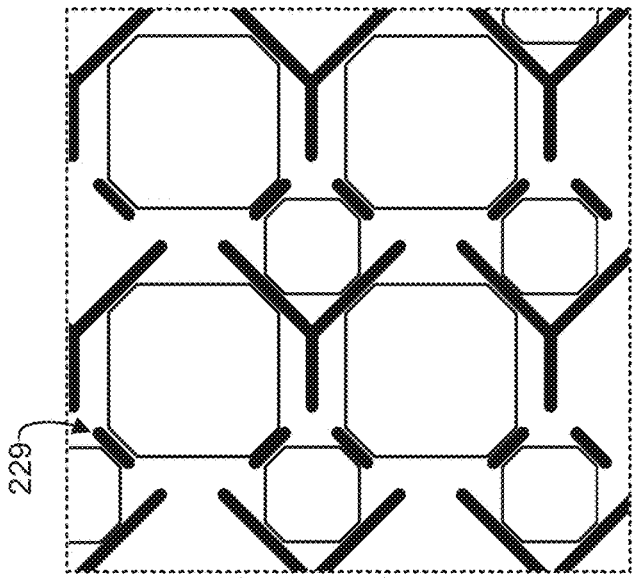

FIGS. 2C-2E illustrate example lithographic patterns from a multiple etching step process for forming the varying depth DTI structure, in accordance with the teachings of the present disclosure. FIG. 2C illustrates a repeat unit of a first lithographic pattern 284 and FIG. 2D illustrates a repeat unit of a second lithographic pattern 286. It is appreciated that the repeat units of the first lithographic pattern 284 and the second lithographic pattern 286 can be arranged to form a pattern that laterally surrounds, when viewed from a first side of a semiconductor substrate, individual photodiodes included in a plurality of small photodiodes and a plurality of large photodiodes as illustrated in FIG. 2E, which corresponds to the cross-sectional shape of the DTI structure 105 illustrated in FIG. 1A.

In some embodiments, the first lithographic pattern 284 and the second lithographic pattern 286 may be utilized for the first etching step (see, e.g., block 215 of FIG. 2B) or the second etching step (see, e.g., block 220) to form the DTI structure with the varying depth surrounding the individual photodiodes included in the plurality of small photodiodes and the plurality of large photodiodes. When the first lithographic pattern 284 and the second lithographic pattern 286 are arranged as shown in FIG. 2E, there is partial overlap between the two patterns, to enable manufacturing of the DTI structure with the varying depth via multiple etching steps. For example, regions 229 illustrated in FIG. 2E represent portions of the collective pattern that are etched twice when the first lithographic pattern 284 and the second lithographic pattern 286 are utilized for respective etching steps. In one embodiment, the first lithographic pattern 284 and the second lithographic pattern 286 are complementary patterns with overlapping patterns at the regions 229 to etch corresponding regions of the underlying semiconductor substrate twice. In the same embodiment, the regions 229 correspond to isolation regions between neighboring photodiodes (e.g., the first photodiode 111-1 and second photodiode 112-2 illustrated in FIGS. 1A-1F). In one embodiment, the first trench is formed using the first lithographic pattern 284, or alternatively the second lithographic pattern 286, and is disposed proximate to the first side of the semiconductor substrate during the first etching step to etch a first trench with a depth corresponding to the second or third depth. In the same or another embodiment, a first portion of the first trench is further etched to the first depth using the second lithographic pattern 286, or alternatively the first lithographic pattern 284, and is disposed proximate to the first side of the semiconductor substrate during the second etching step. It is appreciated that during the second etching step, the first portion of the first trench is further etched while adjacent portions of the first trench (e.g., the second and third portions of the first trench) to the first portion remain at the second or third depth. As illustrated, the first lithographic pattern 284 is different from the second lithographic pattern 286.

Figure 3A:
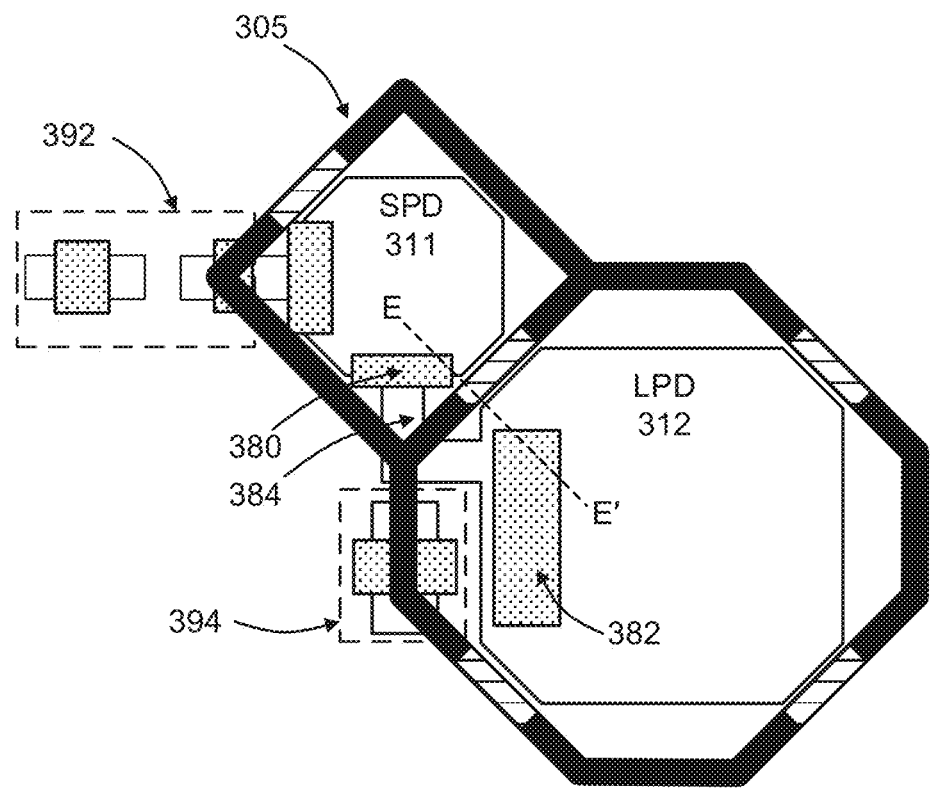
FIG. 3A illustrates regions for circuitry associated with individual photodiodes included in an image sensor with a varying depth deep trench isolation structure, in accordance with the teachings of the present disclosure.

FIG. 3A illustrates regions 392 and 394 for circuitry associated with individual photodiodes included in an image sensor 301 with a varying depth deep trench isolation structure, in accordance with the teachings of the present disclosure. Image sensor 301 is one possible implementation of the image sensor 101 illustrated in FIGS. 1A-1F and may also be manufactured via process 200-A and 200-B illustrated in FIG. 2A-2B. In the illustrated embodiment of FIG. 3A, a view from the first side (e.g., backside) of the image sensor 301 shows a first photodiode 311 (e.g., a small photodiode) adjacent to a second photodiode 312 (e.g., a large photodiode). In some embodiments, the first photodiode 311 and the second photodiode 312 are coupled to a floating diffusion 384 through respective transfer gates 380 and 382. Disposed proximate to the first photodiode 311 and the second photodiode 312 and further proximate to second side (e.g., front side) of the semiconductor substrate are regions 392 and 394 (e.g., transistor regions), which represent example locations for control circuitry (e.g., 3T, 4T, 5T, or other pixel circuitry architectures such as source follower, reset transistor, row select transistor) for reading out image charge or otherwise controlling the operation of coupled first photodiode 311 or the second photodiode 312. It is appreciated that regions 392 and 394 are disposed on or proximate to the second side of the semiconductor substrate and may overlap with a portion of DTI structure 305 disposed proximate to the first side (e.g., backside). It is further appreciated that the specific regions 392 and 394 are one possible implementation and that other locations may also be utilized for control circuitry placement. In the illustrated embodiment, the DTI structure 305 forms a square or diamond shape that laterally surrounds the first photodiode 311 and an octagonal shape that laterally surrounds the second photodiode 312. However, it is appreciated that in other embodiments, the DTI structure 305 may have different shapes.

Figure 3B:
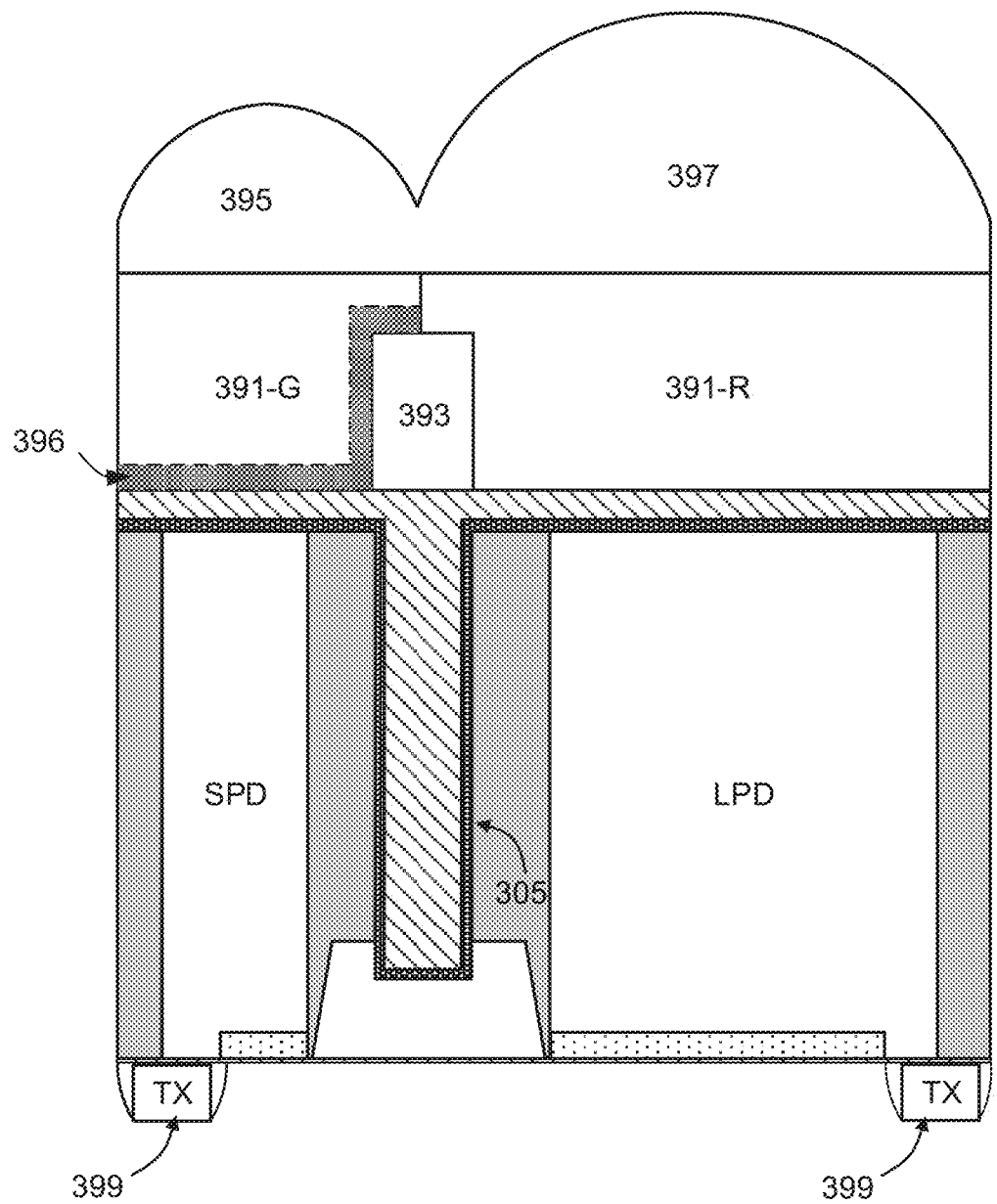
FIG. 3B illustrates a cross-sectional view along the line E-E' shown in FIG. 3A, in accordance with the teachings of the present disclosure.

FIG. 3B illustrates a cross-sectional view of the image sensor 301 along the line E-E' shown in FIG. 3A, in accordance with the teachings of the present disclosure. FIG. 3B is similar in many respects to the view of image sensor 101 shown in FIG. 1A and may include the same features, in accordance with the teachings of the present disclosure. One difference is FIG. 3B shows additional components that may be included in the image sensor architecture, including color filters 391 (e.g., red, green, blue or other color filters), a metal grid 393, a small microlens 395 directing light to small photodiode SPD, a large microlens 397 directing light to large photodiode LPD, and transfer gates 399 coupled to small photodiode SPD and large photodiode, respectively. In the same or other embodiments, the image sensor architecture may optionally further include a light attenuation layer 396. The light attenuation layer 396 may cover the light exposure area of first photodiode SPD to reduce intensity of light incident on the first photodiode SPD that has been directed to the first photodiode SPD by the small microlens 395. In accordance with embodiments of the disclosure, the DTI structure 305 has a varying depth (e.g., along a direction corresponding to "into the page" or "out of the page" of FIG. 3B the depth of DTI structure 305 may change) and is disposed between the first photodiode SPD and the second photodiode LPD to provide isolation therebetween and reduce crosstalk.

Figure 4:
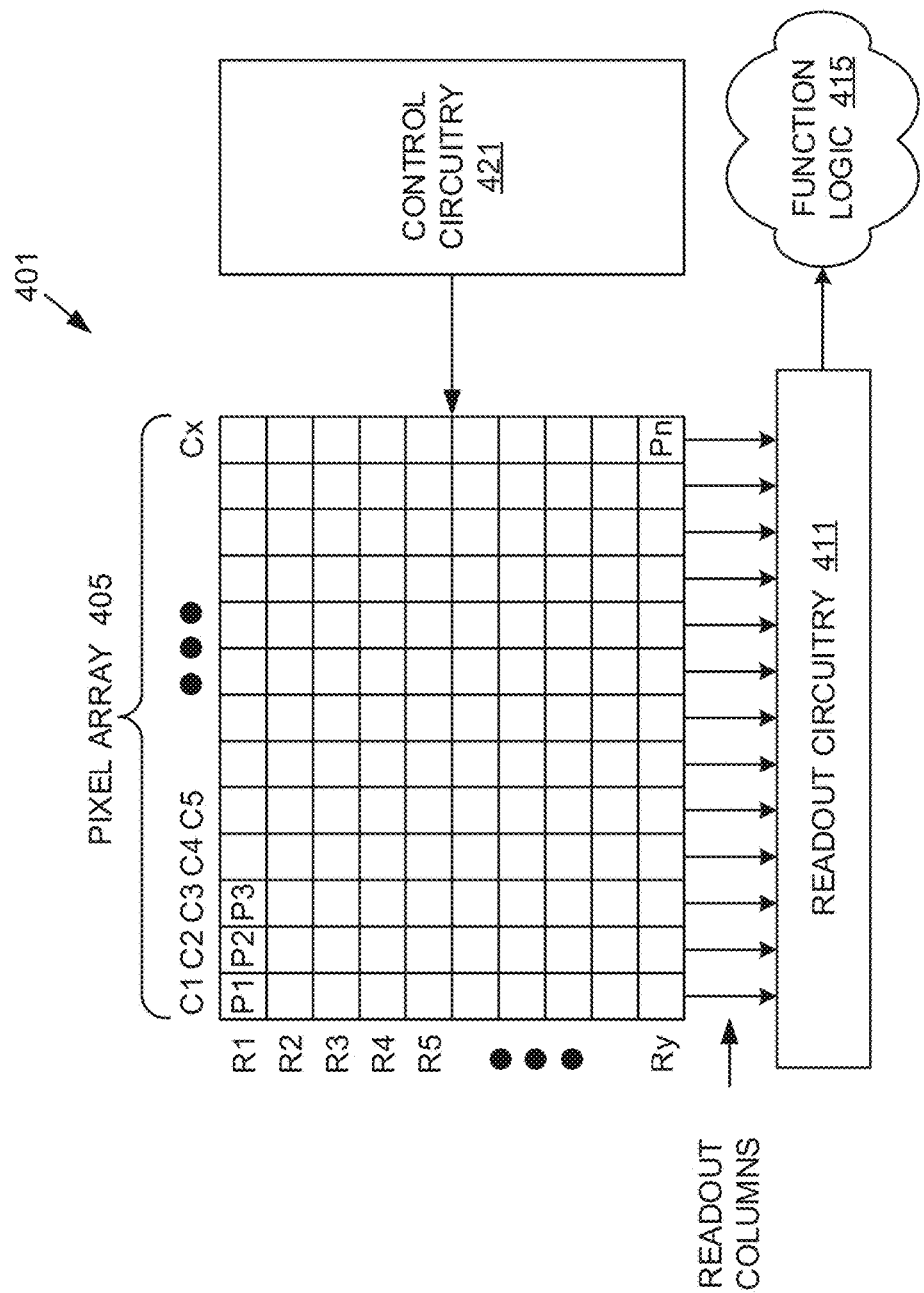
FIG. 4 illustrates an example block diagram of an imaging system including an image sensor with a varying depth deep trench isolation structure, in accordance with the teachings of the present disclosure.

FIG. 4 illustrates an example block diagram of an imaging system 400 including an image sensor 401 with a varying depth deep trench isolation structure, in accordance with the teachings of the present disclosure. Image sensor 401 of imaging system 400 is one possible implementation of image sensor 101 illustrated in FIGS. 1A-1F and image sensor 301 illustrated in FIGS. 3A-3B. Imaging system 400 includes pixel array 405, control circuitry 421, readout circuitry 411, and function logic 415. In one embodiment, pixel array 405 is a two-dimensional (2D) array of photodiodes (see, e.g., first array of SPD 111 and/or second array of LPD 112 illustrated in FIG. 1A), or image sensor pixels (e.g., pixels P1, P2 . . . , Pn). As illustrated, photodiodes are arranged into rows (e.g., rows R1 to Ry) and columns (e.g., column C1 to Cx) to acquire image data of a person, place, object, etc., which can then be used to render an image or video of the person, place, object, etc. However, photodiodes do not have to be arranged into rows and columns and may take other configurations.

In one embodiment, after each image sensor photodiode/pixel in pixel array 405 has acquired its image data or image charge, the image data is readout by readout circuitry 411 and then transferred to function logic 415. In various examples, readout circuitry 411 may include amplification circuitry, analog-to-digital (ADC) conversion circuitry, or otherwise. Function logic 415 may simply store the image data or even manipulate the image data by applying post image effects (e.g., autofocus, crop, rotate, remove red eye, adjust brightness, adjust contrast, or otherwise). In the same or another embodiment, readout circuitry 411 may readout a row of image data at a time along readout column lines (illustrated) or may readout the image data using a variety of other techniques (not illustrated), such as a serial readout or a full parallel readout of all pixels simultaneously. In one embodiment, control circuitry 421 is coupled to pixel array 405 to control operation of the plurality of photodiodes or the image sensor pixel in the pixel array 405. For example, control circuitry 421 may generate a shutter signal for controlling image acquisition.

It is appreciated that imaging system 400 may be included in a digital camera, cell phone, laptop computer, automobile, or the like. Additionally, imaging system 400 may be coupled to other pieces of hardware such as a processor (general purpose or otherwise), memory elements, output (USB port, wireless transmitter, HDMI port, etc.), lighting/flash, electrical input (keyboard, touch display, trackpad, mouse, microphone, etc.), and/or display. Other pieces of hardware may deliver instructions to imaging system 400, extract image data from imaging system 400, or manipulate image data supplied by imaging system 400.

It is further appreciated that while the block diagram illustrated in FIG. 4 shows pixel array 405, readout circuitry 411, function logic 415, and control circuitry 421 as distinct and separate elements from the pixel array, this is not necessarily the case as such features may be combined or otherwise incorporated with the pixel array directly (e.g., within and/or between individual pixels, in the form of stacked substrates, or otherwise). For example, the readout circuitry 411 may include one or more transistors (e.g., associated with 3T, 4T, 5T, or other pixel architectures for reading out image charge from individual pixels), elements of which may be disposed between segments of individual photodiodes in accordance with embodiments of the present disclosure. Furthermore, the image sensor 401 may include features not explicitly illustrated or discussed but known by one of ordinary skill in the art such as color filters, microlenses, a metal grid, and the like. Additionally, it is appreciated that image sensor 401 is fabricable by conventional CMOS manufacturing techniques known by one of ordinary skill in the art, which may include, but is not limited to, photolithography, chemical vapor deposition, physical vapor deposition, ion implantation or diffusion, thermal oxidation, reactive ion etching, wet chemical etching, chemical mechanical polishing, and the like.

The processes explained above may be implemented using software and/or hardware. The techniques described may constitute machine-executable instructions embodied within a tangible or non-transitory machine (e.g., computer) readable storage medium, that when executed by a machine will cause the machine to perform the operations described. Additionally, the processes may be embodied within hardware, such as an application specific integrated circuit ("ASIC"), field programmable gate array (FPGA), or otherwise.

A tangible machine-readable storage medium includes any mechanism that provides (i.e., stores) information in a non-transitory form accessible by a machine (e.g., a computer, network device, personal digital assistant, manufacturing tool, any device with a set of one or more processors, etc.). For example, a machine-readable storage medium includes recordable/non-recordable media (e.g., read only memory (ROM), random access memory (RAM), magnetic disk storage media, optical storage media, flash memory devices, etc.).

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An image sensor, comprising:
   a first photodiode and a second photodiode, each disposed within a semiconductor substrate, and wherein the first photodiode is adjacent to the second photodiode; and
   a deep trench isolation (DTI) structure with a varying depth disposed within the semiconductor substrate between the first photodiode and the second photodiode, wherein the DTI structure extends the varying depth from a first side of the semiconductor substrate towards a second side of the semiconductor substrate, wherein the second side of the semiconductor substrate is opposite to the first side;
   wherein the DTI structure includes a first segment and a second segment adjacent to the first segment, wherein the varying depth includes a first depth of the first segment and a second depth of the second segment, wherein the first depth is greater than the second depth, wherein a first separation distance between the first photodiode and the second photodiode that extends through the first segment is less than a second separation distance between the first photodiode and the second photodiode that extends through the second segment.

2. The image sensor of claim 1, wherein the DTI structure further includes a third segment adjacent to the first segment, wherein the first segment is disposed between the second segment and the third segment to form a contiguous portion of the DTI structure with the varying depth, wherein the varying depth further includes a third depth of the third segment, and wherein the first depth is greater than the third depth.

3. The image sensor of claim 2, wherein the second depth is substantially equal to the third depth.

4. The image sensor of claim 2, further comprising a shallow trench isolation (STI) structure disposed proximate to the second side of the semiconductor substrate between the first photodiode and the second photodiode, wherein the first segment of the DTI structure extends from the first side towards the second side to directly contact the STI structure.

5. The image sensor of claim 4, wherein the second segment and the third segment of the DTI structure do not directly contact the STI structure.

6. The image sensor of claim 4, further comprising a well disposed in the semiconductor substrate between the first photodiode and the second photodiode, wherein the first photodiode and the second photodiode each have a first conductivity type, wherein the well has a second conductivity type opposite of the first conductivity type, and wherein the contiguous portion of the DTI structure, including the first segment, the second segment, and the third segment, and the STI structure are each disposed, at least in part, within the well.

7. The image sensor of claim 6, wherein a first doped portion of the semiconductor substrate forming the well is disposed between the second segment and the STI structure such that the second segment does not directly contact the STI structure, and wherein a second doped portion of the semiconductor substrate forming the well is additionally disposed between the third segment and the STI structure such that the third segment does not directly contact the STI structure.

8. The image sensor of claim 6, wherein the STI structure is aligned with the first segment of the DTI structure, wherein the STI structure and the first segment of the DTI structure have a substantially equal length such that the STI structure is not disposed between the second segment of the DTI structure and the second side of the semiconductor substrate.

9. The image sensor of claim 2, wherein the contiguous portion of the DTI structure, including the first segment, the second segment, and the third segment, is formed of at least an oxide material.

10. The image sensor of claim 1, wherein the first photodiode has a first full well capacity and the second photodiode has a second full well capacity greater than the first full well capacity of the first photodiode.

11. The image sensor of claim 10, wherein the first photodiode has a first cross-sectional shape including a first truncated edge, wherein the second photodiode has a second cross-sectional shape including a second truncated edge, wherein the first photodiode and the second photodiode are positioned within the semiconductor substrate such that the first truncated edge faces the second truncated edge, and wherein the first segment of the DTI structure is disposed between the first truncated edge of the first photodiode and the second truncated edge of the second photodiode.

12. The image sensor of claim 11, wherein the first segment extends a length between the first truncated edge and the second truncated edge such that the second segment is not disposed between the first truncated edge of the first photodiode and the second truncated edge of the second photodiode.

13. The image sensor of claim 10, further comprising:
a plurality of small photodiodes, including the first photodiode, disposed in the semiconductor substrate to form a first array of small photodiodes;
a plurality of large photodiodes, including the second photodiode, disposed in the semiconductor substrate to form a second array of large photodiodes, and
wherein the first array of small photodiodes is interspersed with the second array of large photodiodes such that each individual small photodiode included in the plurality of small photodiodes is laterally surrounded by neighboring large photodiodes included in the plurality of large photodiodes; and wherein the DTI structure individually surrounds each of the plurality of small photodiodes and the plurality of large photodiodes.

14. The image sensor of claim 13, wherein a corresponding instance of the contiguous portion of the DTI structure with the varying depth is disposed between each adjacent small-large photodiode pair included in a pixel array formed by the first array of the plurality of small photodiodes interspersed with the second array of the plurality of large photodiodes.

15. The image sensor of claim 1, wherein the first separation distance and the second separation distance extend from the first photodiode to the second photodiode along a common direction, wherein the common direction is perpendicular to a length of the DTI structure extending between the first photodiode and the second photodiode, and wherein a depth of a distal end of the DTI structure changes along the length of the DTI structure.

16. An image sensor, comprising:
a first photodiode and a second photodiode, each disposed within a semiconductor substrate, and wherein the first photodiode is adjacent to the second photodiode; and
a deep trench isolation (DTI) structure with a varying depth disposed within the semiconductor substrate between the first photodiode and the second photodiode, wherein the DTI structure extends the varying depth from a first side of the semiconductor substrate towards a second side of the semiconductor substrate, wherein the second side of the semiconductor substrate is opposite to the first side;
wherein a depth of a distal end of the deep trench isolation structure changes along a direction perpendicular to a lateral separation distance between the first photodiode to the second photodiode.

* * * * *